(12) United States Patent
Weimer et al.

(10) Patent No.: US 6,498,345 B1
(45) Date of Patent: Dec. 24, 2002

(54) PARTICLE BEAM DEVICE

(75) Inventors: Eugen Weimer, Essingen (DE); Volker Drexel, Königsbronn (DE)

(73) Assignee: LEO Elektronenmikroskopie GmbH (DE)

( * ) Notice: Subject to any disclaimer, the term of this patent is extended or adjusted under 35 U.S.C. 154(b) by 0 days.

(21) Appl. No.: 09/339,348

(22) Filed: Jun. 23, 1999

(30) Foreign Application Priority Data

Jun. 26, 1998 (DE) .......................... 198 28 476

(51) Int. Cl.[7] .................. H01J 37/244; H01J 37/256
(52) U.S. Cl. .................. 250/310; 250/306; 250/307; 250/397
(58) Field of Search .................. 250/492.2, 310, 250/306, 305, 397

(56) References Cited

U.S. PATENT DOCUMENTS

| | | | | |
|---|---|---|---|---|
| 4,528,452 A | * | 7/1985 | Livesay | 250/491.1 |
| 4,831,266 A | | 5/1989 | Frosien et al. | |
| 4,896,036 A | | 1/1990 | Rose et al. | |
| 4,926,054 A | | 5/1990 | Frosien | |
| 5,063,293 A | * | 11/1991 | Rich et al. | 250/308 |
| 5,466,940 A | | 11/1995 | Litman et al. | |
| 5,644,132 A | | 7/1997 | Litman et al. | |
| 5,894,124 A | * | 4/1999 | Iwabuchi et al. | 250/310 |
| 5,945,672 A | * | 8/1999 | Knowles et al. | 250/310 |
| 6,084,238 A | * | 7/2000 | Todoroko et al. | 250/310 |
| 6,201,240 B1 | * | 3/2001 | Dotan et al. | 250/310 |

FOREIGN PATENT DOCUMENTS

| | | |
|---|---|---|
| EP | 0 490 154 A2 | 6/1992 |
| EP | 0 769 799 A2 | 4/1997 |
| WO | WO 99/46797 | 9/1999 |

OTHER PUBLICATIONS

Nuclear Instruments and Methods in Physics Research A 363 (1995) 31–42, Low–Voltage Probe forming columns for electrons. S. Beck, E. Plies and B. Scheibel.
U.S. patent applications Ser. No. 09/123,017, Weimer et al., filed Jul. 27, 1998.
Khursheed A: "High Speed Electron–Beam Testing of VLSI Circuits by Backscattered Electron Detection", Electronics Letters, Bd. 26, Nr. 20, Sep. 27, 1990, Seiten 1657–1658, XP000109541, ISSN: 0013–5194.
European Search Report dated Jun. 1, 2001 (2 pages) for EP 99 10 9886.

* cited by examiner

*Primary Examiner*—John R. Lee
*Assistant Examiner*—David A Vanore

(57) ABSTRACT

In an electron beam device such as a raster electron microscope, two annular detectors are arranged at a distinct distance along the optical axis between a beam producer and an objective. The distance between the two detectors amounts to at least 25% of the distance between the specimen-side detector and the specimen. The source-side detector serves for detection of back-scattered or secondary electrons which are transmitted through the bore provided through the specimen-side detector for the passage of the primary particle beam. The source-side detector is a conversion diaphragm with an Everhart Thornley detector arranged laterally thereof. The conversion diaphragm produces secondary electrons on impingement of charged particles. By application of two detectors offset in the direction of the optical axis, the yield of the secondary electrons used for image production is increased. The secondary electrons are separated according to their angle of emergence from the specimen.

19 Claims, 2 Drawing Sheets

PARTICLE BEAM DEVICE

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention relates to particle beam devices with ions or electrons, and more particularly to such devices that are used for imaging, analyzing, and processing of specimen surfaces.

For image production a focused particle beam is guided in a raster over the specimen surface and the signals which result from interaction with the primary particles are sensed and associated with their respective place of origin. Besides a high spatial resolution which is attained by a small diameter of the particle beam in the plane of the specimen, as high as possible an efficiency of the detection of the different signals is required.

2. Discussion of Relevant Art

The resolution of particle beam devices is in principle at its best when the specimen is situated very close to the objective lens or even inside this lens. This has as a consequence that the detection system for the detection of secondary particles and/or back-scattered particles must be arranged inside the objective lens or in a region which is free from fields and is between the objective lens and the particle source. The best resolution, particularly at low particle energies, is attained with arrangements in which the particles in the beam production system are first accelerated to a high energy and are braked to the desired energy at the end of the particle optical arrangement in an objective lens or in the region between the objective lens and the specimen.

Corresponding particle beam devices are described in, for example, U.S. Pat. No. 4,831,266 and U.S. Pat. No. 4,926,054. A very high resolution is attained even at low particle energies by means of the combination of an electrostatic lens and a magnetic field in the objective lens. Furthermore, the particles emitted by the specimen by back-scattering or in other ways are accelerated in the opposite direction by the electrostatic field and are imaged on an annular scintillation detector above the objective lens. In U.S. Pat. No. 4,896,036, a similar arrangement is described, likewise with an annular detector, but the objective lens is of course a purely electrostatic lens.

In these known systems, it has been found to be disadvantageous that the annular detector with scintillator and glass light conductor has to have a relatively large aperture of about 2–3 mm so that the primary particle beam is not obstructed by the annular detector. Computations and experiments have shown that up to about 80% of the particles arising at the specimen pass through the central opening of the detector and are therefore not detected. The detected signal is therefore very weak. Furthermore, the detected particles are not sensed integrally, and consequently cannot be separated according to energy and starting angle.

It is known from an article in Nuclear Instruments & Methods in Physics Research A, Vol. 363, pp. 31–42 (1995) to deflect, in regions far from the axis, particles emitted from the specimen or back-scattered at the specimen, without appreciably affecting the primary particle beam, by a suitable arrangement of two Wien filters. This means indeed leads to an improvement of the detector efficiency; here also, however, a discrimination of the detected signals according to starting angle and the like is not possible.

A raster electron microscope is described in U.S. Pat. No. 5,644,132, in which the annular detector has several annular divisions. Electrons back-scattered at the specimen, which are more strongly detectable in the region near the axis than are secondary electrons, are to be separated from the secondary electrons which mainly are far from the axis by this division. In connection with an embodiment example, the possibility is also mentioned that for reasons of mounting, the inner annular detector and the outer annular detector can be arranged to be slightly offset in the direction of the optical axis. Such an annular division of the detector indeed basically permits a separation of the detected electrons according to their starting angle on emergence from the specimen. The problem that a large fraction of the secondary electrons and of the back-scattered electrons is transmitted through the central bore region and consequently not detected at all cannot be solved by this annular division of the detector, however.

SUMMARY OF THE INVENTION

The present invention has as its object to improve the detection in a particle beam device of the secondary particles emitted by the specimen and the particles which are back-scattered at the specimen. Furthermore, a selection or coordination of the detected particles according to their starting angle is to be possible.

This object is attained according to the invention by a particle beam device comprising a beam producer, an objective that focuses a particle beam onto a specimen, and two detectors arranged between the beam producer and the focal plane of the objective for particles back-scattered and emitted from the object. The two detectors are arranged offset from each other in the direction of the optical axis, and the distance between the two detectors is at least 25% of the distance between an object-side detector of the two detectors and the focal plane of the objective. Advantageous embodiments of the invention will become apparent from the features described in the specification and set forth in the claims.

In the particle beam device according to the invention, two detectors for the particles back-scattered from the object or for the particles emitted from the object are arranged, mutually offset in the direction of the optical axis of the particle beam device. The spacing between the two detectors in the direction of the optical axis amounts to at least 25% of the distance between the object-side detector and the focal plane of the objective, which focuses the particle beam on the specimen. The specimen-side detector then serves for the detection of those particles which emerge from the specimen at a relatively large solid angle, while the source-side detector serves for the detection of those particles which emerge from the specimen at a relatively small solid angle, and which are transmitted through the opening provided through the specimen-side detector for the passage of the primary particle beam through it. By means of the axially offset arrangement of the two detectors, even the particles transmitted through the central opening of the object-side detector can be detected with the source-side detector, when both detectors have central openings of the same diameter.

Preferably, however, the central opening for the passage of the primary particle beam at the source-side detector should amount to at most a third of the diameter of the central bore of the object-side detector. Correspondingly small bore diameters, of less than 0.2 mm for example, are then possible through the source-side detector, when this detector is embodied as a conversion diaphragm, at which secondary electrons again arise on to the impingement of high energy particles themselves. The secondary electrons emerging from the conversion diaphragm are then detected by a laterally arranged conventional detector, which produces an electrostatic extraction field for the secondary electrons emerging from the conversion diaphragm. The material of the conversion diaphragm should be a relatively light element with an atomic number $\leq 20$, e.g., aluminum or carbon, since such light elements have a relatively high secondary electron yield.

As in the prior art mentioned at the beginning, both detectors have an annular detection surface and are symmetrical with respect to the optical axis. In contrast to the prior art mentioned at the beginning, however, the external diameter of the detection surface of the source-side detector is greater than the diameter of the central bore of the specimen-side detector.

Insofar as the source-side detector has only a very small bore bounding the aperture of the primary beam for the primary beam to pass through, this detector is to be received on an adjusting device which permits an adjustment of the detector in the two directions perpendicular to the optical axis.

For the evaluation of the signals detected with the two detectors, a signal processing electronics can be provided which produces output signals from the detector signals corresponding to linear combinations of both detector signals. By the formation of corresponding linear combinations, the effects of the surface topography of the specimen can be amplified, and charge contrast images can be produced. This is advantageous in particular when thin layers with conductivity different from the matrix are investigated in the particle beam device. The coefficients of the linear combination are then to be freely selectable by the user of the particle beam device.

BRIEF DESCRIPTION OF THE DRAWINGS

Details of the invention are more fully explained hereinbelow with reference to the drawings, in which.

DETAILED DESCRIPTION OF PREFERRED EMBODIMENTS

Figure 1:
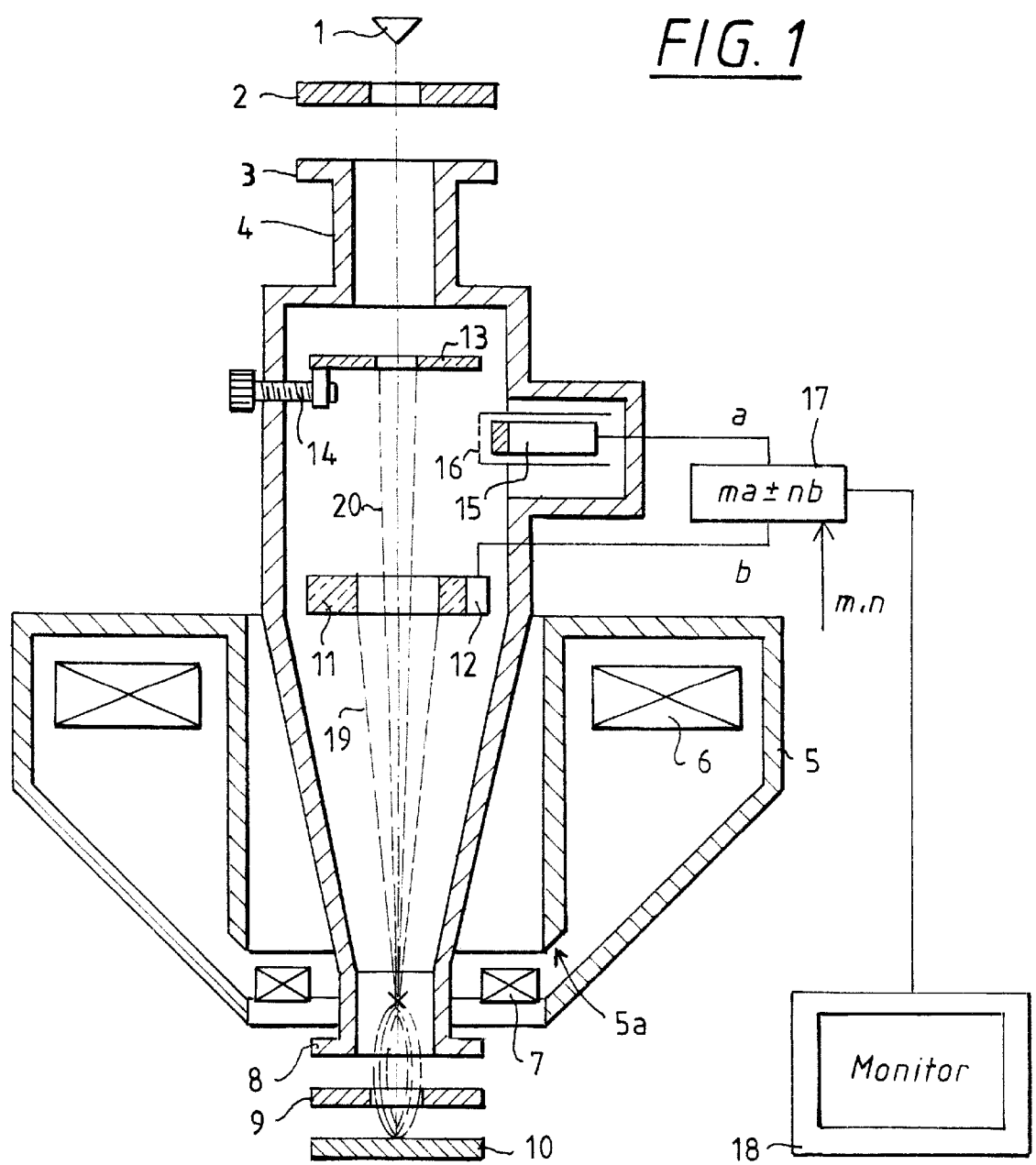
FIG. 1 shows a sketch of principles of a raster electron microscope, in which the invention is realized, in cross section.

The particle beam producer in the particle beam device according to the invention consists of a cathode (1) which emits the particles, an extraction electrode (2) and an anode (3). When the particle beam device is embodied as a raster electron microscope, the cathode (1) is preferably a thermionic field emitter. The particles emerging from the cathode (1) are accelerated to the anode potential by the potential difference (not shown in FIG. 1) between the cathode (1) and the anode (3).

The anode (3) forms at the same time the source-side end of the beam guiding tube (4). This beam guiding tube (4), of electrically conducting material, is passed through the bore through the pole shoe (5) of a magnetic lens acting as an objective, and is thickened at the object-side end as a tube lens. This thickened object-side end of the beam guiding tube (4) does not end until behind the pole shoe gap (5a) of the magnetic lens, the coil of which is denoted by (6). A single electrode (9) is arranged after the beam guiding tube and, in common with the tubular electrode (8) of the beam guiding tube, forms an electrostatic braking device. The tubular electrode (8), in common with the whole beam guiding tube (4), is at the anode potential, while the single electrode (9) and the specimen (10) are at a potential which is lower with respect to the anode potential, so that the particles after exiting the beam guiding tube are braked to the desired lower energy.

A further deflecting system (7) is arranged in the bore of the pole shoe (5) of the objective lens, at the level of the pole shoe gap (5a), and by means of it the primary electrode beam, which is focused on the specimen (10) by means of the objective (5), is deflected perpendicularly of the optical axis (shown by a dot-dash line) for scanning the specimen (10) in a raster pattern.

Insofar as just described, the raster electron microscope has a structure like that described in U.S. patent application Ser. No. 09/123,017. Reference is made to this earlier Application regarding the potentials applied to the cathode (1), extraction electrode (2), anode (3) and braking electrode (9).

Alternatively to the illustration in FIG. 1, the beam guiding tube (4) can also end at the level of the pole shoe gap (5a), and the braking electrode can be arranged at about the level of the pole shoe gap (5a). The braking of the primary particles to the desired impingement energy then already takes place within the objective, so that the magnetic field of the objective lens and the electrostatic retarding field are spatially superimposed.

For the detection of the particles emerging from the sample (10), the back-scattered electrons and the secondary electrons, two detectors are arranged within the beam guiding tube (4) between the beam producer and the objective (5, 6), and are mutually offset in the direction of the optical axis. Both detectors have an annular detection surface, which is substantially symmetrical with respect to the optical axis. The object-side detector is then embodied in a known manner as a scintillator with a glass light conductor (11) and an optical detector (12). The glass light conductor (11) serves here for the conversion of the arriving electrons into photons and simultaneously for conducting the photons to the optical detector (12). Since the glass light conductor has a relatively large thickness of about 5–7 mm in the direction of the optical axis, for a high efficiency of light conduction, the bore through the glass light conductor for the passage of the primary beam has a diameter of 2–3 mm, so that the primary beam is not affected by the glass light conductor.

The specimen-side detector (11, 12) serves for the detection of those particles which emerge at a relatively large solid angle from the specimen (10). Principally concerned here are secondary electrons; their kinetic energy on emerging from the specimen (10) is in the region of 1–50 eV with a maximum at 2–4 eV. Electrons which are back-scattered at the specimen (10), and which in comparison with the secondary electrons have a relatively high kinetic energy on emerging from the specimen (10), are sensed only to a very small degree by the detector (11), on the other hand. The back-scattered electrons emerge from the specimen at a solid angle of 0–5° relative to the optical axis, and transmit through the hole through the detector (11), and those electrons which emerge from the sample at an angle of >15° already collide in the pole shoe region with the beam guiding tube (4) and are absorbed there.

The source-side detector contains an annular conversion diaphragm (13) which is received on an adjusting device (14) and which is clearly spaced apart from the specimen-side detector (11) in the direction of the optical axis. The conversion diaphragm (13) is adjustable in both directions perpendicularly to the optical axis by means of the adjusting device (14). The conversion diaphragm is a thin plate with a thickness of 0.1–1 mm of a material of low atomic number, and has a small central hole for the primary electron beam to pass through; the hole diameter is about 200–400 μm. Because of the small hole diameter, the conversion diaphragm (13) limits the aperture for the primary electron beam, and thus acts at the same time as an aperture diaphragm.

The conversion diaphragm consists of a material of low atomic number, for example aluminum, so that electrons impinging on the conversion diaphragm (13) release secondary electrons again with quite high efficiency. An Everhart Thornley detector (15) is arranged on the specimen side of the conversion diaphragm (13) and laterally of the optical axis, for the detection of these secondary electrons released from the conversion diaphragm. This Everhart Thornley detector has a potential applied by a grid electrode (16) about 6–10 kV higher than the potential of the conversion diaphragm (13), which is at the anode potential. Secondary electrons emerging from the conversion diaphragm (13) are extracted and accelerated toward the detector (15) by this potential difference.

The distance along the optical axis between the detection plane of the specimen-side detector (11) and the conversion diaphragm (13) is at least 25%, preferably about 50–75%, of the distance between the detector surface of the specimen-side detector (11) and the specimen (10). The external diameter of the conversion diaphragm (13) is at the same time greater than the diameter of the opening through the specimen-side detector (11). This geometrical arrangement insures that a large portion of the electrons (20) emerging from the specimen (10) and transmitted through the opening of the specimen-side detector (11) are detected by the source-side detector (13).

Figure 2:
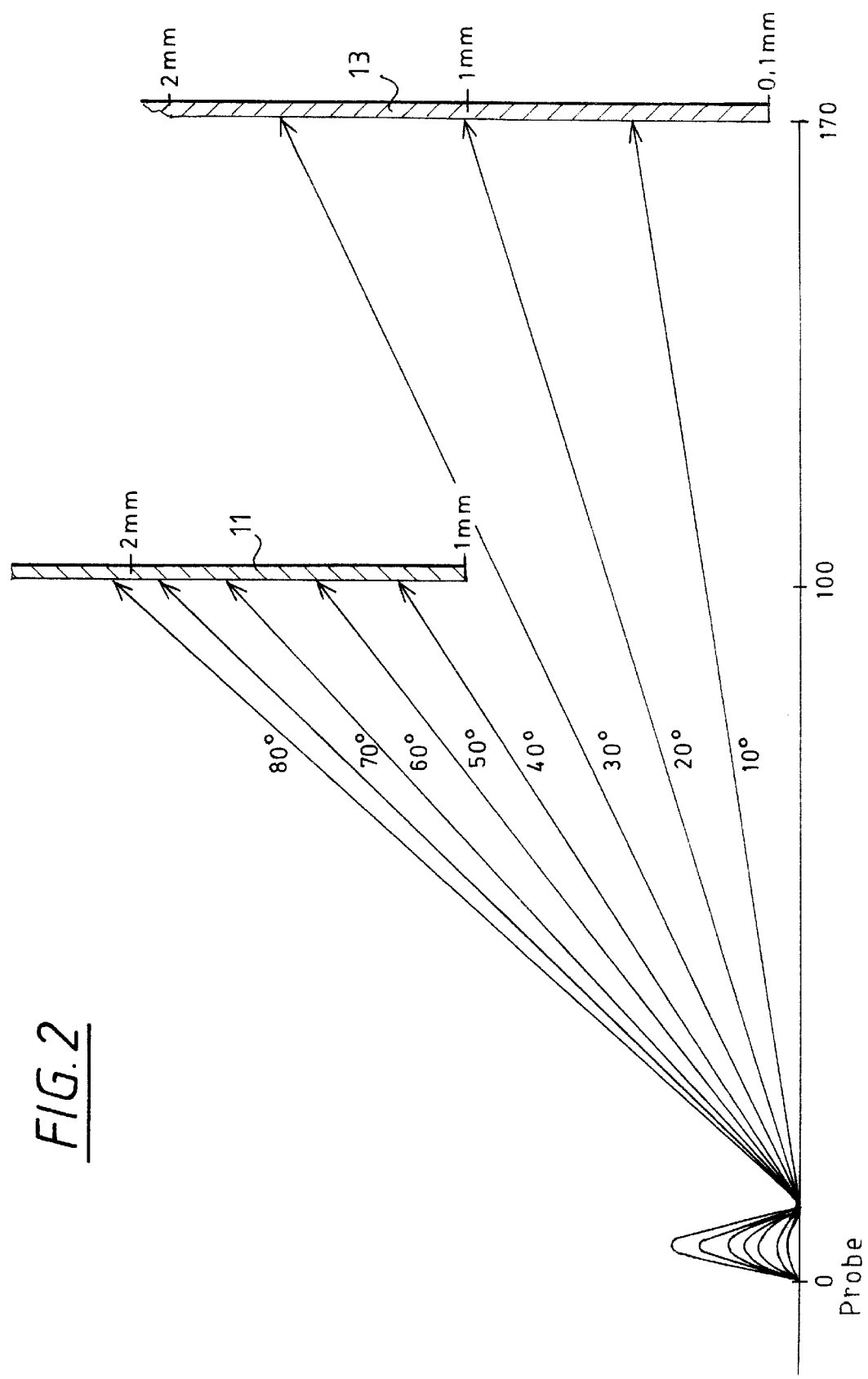
FIG. 2 shows a diagram of the electron paths for secondary electrons in dependence on the starting angle at the specimen surface.

The action produced with the two detectors arranged offset in the direction of the optical axis is made clear with reference to FIG. 2. The paths are drawn there for secondary electrons which emerge from the specimen at different angles with a kinetic energy of 3 eV on leaving the specimen for the case in which the energy of the primary particle beam when it impinges on the specimen is 1 keV and the distance between the specimen and the objective lens is 5 mm. For the sake of better illustration, the distance of the electron paths from the optical axis is shown increased by a factor of 50, and the paths of the electrons after their intersection with the optical axis are shown mirrored. The distance between the detector plane of the specimen-side detector (11) is 100 mm. The radius of the central opening through the specimen-side detector (11) is 1 mm. As can be seen from the diagram of the course of the paths, only those secondary electrons are detected with the specimen-side detector (11) which emerge at an angle of greater than about 35° from the specimen (10). With a conducting specimen with a flat surface, the different possible starting angles on emerging from the specimen are distributed according to a Lambert cosine distribution. The result is that about 40% of the secondary electrons emergent from the specimen have an angle of less than 30° relative to the optical axis, so that about 40% of the secondary electrons emergent from the specimen cannot be sensed by the specimen-side detector. In the case of a non-conducting specimen surface, in practice nearly all the electrons are emitted at very small angles to the normal to the surface, because of local charging effects, so that in this case, which is very important in practice, even only less than 20% of the secondary electrons emergent from the specimen can be detected with the specimen-side detector (11).

A large portion of the secondary electrons transmitted through the opening of the specimen-side detector (11) are detected, in the arrangement according to the invention, by the source-side detector (13). This source-side detector (13) has in FIG. 2 a distance of 70 mm to the detection plane of the specimen-side detector (11). The diameter of the source-side detector (13) or of its detection surface is thus greater than the diameter of the central opening in the specimen-side detector (11). Furthermore, the source-side detector (13) has only a very small central opening with a radius of 0.1 mm, so that this detector diaphragm acts to limit the aperture of the primary particle beam.

As is apparent from the course of the paths in FIG. 2, there can also be detected with the source-side detector, those secondary electrons which emerge from the specimen at an angle below 35°. If the secondary electrons which are detected overall with the two detectors (11, 13) are combined, the result is that in the arrangement of detectors according to the invention, all those secondary electrons are sensed which emerge from the specimen at an angle of greater than 2–3°. The signal gain by means of the second, source-side detector amounts to about 40% in the case of a conducting, flat specimen, and up to 80% in the case of non-conducting specimen surfaces.

Furthermore, by suitable mixing of the output signals of both detectors (11,13), particularly by the formation of sums and differences, the surface topography is amplified and a charge contrast is produced. For this mixing of the two detector signals (a, b), the particle beam device in FIG. 1 has a signal processing unit (17) which forms optionally predeterminable linear combinations of the two detector signals (a, b). The coefficients of the linear combination can then be optionally predetermined by the user, which is indicated in FIG. 1 by the arrow with the small letters. The output signal of the signal processing (17) is subsequently displayed on a monitor (18) or is stored in an image storage device (not shown in the drawing) for a more detailed image processing.

The described arrangement with two annular detectors which are clearly offset in the direction of the optical axis, and of which the detector more remote from the specimen has only a very small central opening, is particularly useful in cases in which the primary energy of the electrons of average energies can be varied over 5 keV down to the lowest primary energies under 200 eV on impinging on the specimen. Because it has been found that at primary energies below 200 eV, particularly in the primary energy region of 20–100 eV, a very large fraction of the secondary electrons is deflected by the objective, independently of their emergent angle from the specimen, such that their paths in the region of the specimen-side detector run very close to the optical axis and therefore are not detectable with this detector. These secondary electrons are efficiently detected with the source-side detector. At the same time, the specimen-side detector makes possible, at higher primary energies, the detection of those secondary electrons, which emerge from the specimen at a large angle relative to the optical axis.

The invention makes possible, not only a separation of the secondary electrons according to their angle of emergence from the specimen, but also a separation according to their energy on emerging from the specimen. Because the paths of the low energy secondary electrons run, independently of their angle of emergence, closer to the optical axis than the paths of the higher-energy secondary electrons, principally lower energy secondary electrons are detected with the source-side detector and higher energy secondary electrons are detected with the specimen-side detector.

The invention was explained with reference to the embodiment shown in the Figures for the case that the primary particles are electrons. When the invention is used for positively charged particles, only the polarity of the different potentials needs to be changed to the opposite sign, to match the particle charge.

Furthermore, it is not imperative for the objective to be embodied as a magnetic lens. It is also conceivable, and in particular advantageous when heavy particles such as ions are used as the primary particles, to use an electrostatic lens for the focusing of the particles. Such an electrostatic lens can in a known manner be constructed from three successive outer electrodes, of which the two outer electrodes are at the potential of the beam guiding tube and the middle electrode is then at a potential which corresponds with respect to the polarity of the cathode potential, but is somewhat smaller in magnitude. Such an electrostatic Einzel lens leads, in contrast to the electrostatic immersion lens, to a smaller change of the particle energy.

Furthermore, the particle beam device can also have further particle-optic imaging elements, such as, e.g., arranged between the particle source and the source-side detector, a single-stage or multi-stage condenser for varying the probe size on the specimen or the aperture of the particle beam.

We claim:

1. A particle beam device having an optical axis, and comprising:
   a beam producer,
   an objective having a focal plane that focuses a particle beam onto a specimen,
   an electrostatic braking device by which an energy of said particle beams impinging on said specimen is varied from a primary energy above 5 keV down to a lowest primary energy below 200 eV,
   two detectors arranged between said beam producer and said focal plane of said objective for particles backscattered or emitted from said specimen,
   wherein said two detectors are arranged offset from each other in the direction of the optical axis, and the distance between said two detectors is between 50% and 75% of the distance between a specimen-side detector of said two detectors and said focal plane of said objective.

2. The particle beam device according to claim 1, wherein the outer diameter of a particle-sensitive surface of a source-side detector of said two detectors is greater than the diameter of a central opening of said object-side detector.

3. The particle beam device according to claim 1, wherein both of said two detectors have an annular detection surface that is arranged symmetrically with respect to the optical axis.

4. The particle beam device according to claim 2, wherein both of said two detectors have an annular detection surface that is arranged symmetrically with respect to the optical axis.

5. The particle beam device according to claim 2, wherein a central opening for passage of a primary beam through said source-side detector is no more than a third of said central opening of said object-side detector.

6. The particle beam device according to claim 3, wherein a central opening for passage of a primary beam through said source-side detector is no more than a third of said central opening of said object-side detector.

7. The particle beam device according to claim 1, wherein a source-side detector of said two detectors comprises a conversion diaphragm with a scintillation detector and wherein said scintillation detector has an extraction field for charged particles emergent from said conversion diaphragm.

8. The particle beam device according to claim 7, wherein said conversion diaphragm comprises a material with an atomic number of no greater than 20.

9. The particle beam device according to claim 7, further comprising an adjusting device that receives said conversion diaphragm.

10. The particle beam device according to claim 8, further comprising an adjusting device that receives said conversion diaphragm.

11. The particle beam device according to claim 1, further comprising a signal processor that produces from output signals of said two detectors, output signals that correspond to linear combinations of said output signals of said two detectors.

12. The particle beam device according to claim 11, wherein coefficients [m, n] of said linear combination are freely selectable.

13. The particle beam device according to claim 2, wherein a source-side detector of said two detectors comprises a conversion diaphragm with a scintillation detector, wherein said scintillation detector has an extraction field for charged particles emergent from said conversion diaphragm.

14. The particle beam device according to claim 3, wherein a source-side detector of said two detectors comprises a conversion diaphragm with a scintillation detector, wherein said scintillation detector has an extraction field for charged particles emergent from said conversion diaphragm.

15. The particle beam device according to claim 4, wherein a source-side detector of said two detectors comprises a conversion diaphragm with a scintillation detector, wherein said scintillation detector has an extraction field for charged particles emergent from said conversion diaphragm.

16. The particle beam device according to claim 5, wherein a source-side detector of said two detectors comprises a conversion diaphragm with a scintillation detector, wherein said scintillation detector has an extraction field for charged particles emergent from said conversion diaphragm.

17. The particle beam device according to claim 6, wherein a source-side detector of said two detectors comprises a conversion diaphragm with a scintillation detector, wherein said scintillation detector has an extraction field for charged particles emergent from said conversion diaphragm.

18. The particle beam device according to claim 2, further comprising a signal processor that produces from output signals of said two detectors, output signals that correspond to linear combinations of said output signals of said two detectors.

19. The particle beam device according to claim 3, further comprising a signal processor that produces from output signals of said two detectors, output signals that correspond to linear combinations of said output signals of said two detectors.

* * * * *